United States Patent
Guo et al.

(10) Patent No.: US 12,446,365 B2
(45) Date of Patent: Oct. 14, 2025

(54) LIGHT-EMITTING DISPLAY DEVICE BASED ON SPECIAL-SHAPED nLED GRAINS

(71) Applicants: FUZHOU UNIVERSITY, Fujian (CN); MINDU INNOVATION LAB, Fujian (CN)

(72) Inventors: Tailiangi Guo, Fujian (CN); Yalian Sweng, Fujian (CN); Xiongtu Zhou, Fujian (CN); Yongai Zhang, Fujian (CN); Chaoxing Wu, Fujian (CN); Zhixian Lin, Fujian (CN); Qun Yan, Fujian (CN)

(73) Assignees: FUZHOU UNIVERSITY, Fujian (CN); MINDU INNOVATION LAB, Fujian (CN)

( * ) Notice: Subject to any disclaimer, the term of this patent is extended or adjusted under 35 U.S.C. 154(b) by 0 days.

(21) Appl. No.: 17/768,473

(22) PCT Filed: Aug. 31, 2020

(86) PCT No.: PCT/CN2020/112396
§ 371 (c)(1),
(2) Date: Apr. 13, 2022

(87) PCT Pub. No.: WO2021/073284
PCT Pub. Date: Apr. 22, 2021

(65) Prior Publication Data
US 2024/0297268 A1    Sep. 5, 2024

(30) Foreign Application Priority Data

Oct. 16, 2019 (CN) .......................... 201910982273.3

(51) Int. Cl.
*H01L 33/24* (2010.01)
*H01L 25/075* (2006.01)
*H01L 33/42* (2010.01)

(52) U.S. Cl.
CPC .......... *H01L 33/24* (2013.01); *H01L 25/0753* (2013.01); *H01L 33/42* (2013.01)

(58) Field of Classification Search
CPC ...... H01L 33/24; H01L 25/0753; H01L 33/42
(Continued)

(56) References Cited

U.S. PATENT DOCUMENTS

| | | | |
|---|---|---|---|
| 2014/0246648 A1* | 9/2014 | Im | H01L 33/382 257/13 |
| 2015/0001557 A1* | 1/2015 | Yoon | H05K 1/189 438/27 |
| 2016/0056325 A1* | 2/2016 | Maeng | H01L 33/325 257/13 |

* cited by examiner

*Primary Examiner* — Xia L Cross
(74) *Attorney, Agent, or Firm* — Jose Cherson Weissbrot

(57) ABSTRACT

A light-emitting display device based on special-shaped nLED grains comprises an upper drive electrode substrate, an upper drive electrode, special-shaped nLED grains, a lower drive electrode and a lower drive electrode substrate that are sequentially arranged from top to bottom, and is further provided with an AC drive control module having two ends connected to the upper drive electrode and the lower electrode respectively. The special-shaped nLED grains are nLED grains each comprising a non-planar luminous layer. The drive electrode is isolated from the nLED grains by insulating dielectric layer. In presence of the AC drive signal, the nLED grains are lighted up through electromagnetic coupling. By adoption of special-shaped nLED grains, when a grain sheet is disposed between the electrode substrates, the luminous layer of each nLED grain is always partially parallel to the electrode substrates and perpendicular to an electric field, thus greatly improving electrical coupling efficiency and luminous efficiency.

10 Claims, 2 Drawing Sheets

(58) Field of Classification Search
USPC .......................................................... 257/79
See application file for complete search history.

LIGHT-EMITTING DISPLAY DEVICE BASED ON SPECIAL-SHAPED nLED GRAINS

BACKGROUND OF THE INVENTION

1. Technical Field

The invention relates to the field of integrated semiconductor light-emitting and display, in particular to a light-emitting display device based on special-shaped nLED grains.

2. Description of Related Art

LED display has been widely applied to various occasions because of its advantages of self-illumination, high brightness and luminous efficacy, low power consumption and high stability. With the decrease of the size of LED chips and the pixel pitch, LED display is expected to fulfill flexible, highly-transparent, interactive and modularly-stitched display and is regarded as a revolutionary display technique with complete functions and capable of being applied to all fields. Wherein, μLED display is a novel display technique based on an array formed by micron-sized LED light-emitting pixels, and nLED (nano-LED) display is a novel display technique based on an array formed by nano-sized LED light-emitting pixels. At present, leading LED chip manufacturers, display panel manufacturers and display application manufacturers at home and abroad have actively devoted to the development of ultrahigh-density and small-pitch LED (μLED and nLED) display. However, when the size of LED chips decreases to a certain degree, operations on the chips will become increasingly difficult. Particularly, for nLED grains, how to transfer grains with different light-emitting colors onto a circuit substrate with mechanical tools and fulfill accurate electrical contact between the μLED grains and drive electrodes through perfect alignment and bonding have become a great technical challenge.

BRIEF SUMMARY OF THE INVENTION

In view of this, the objective of the invention is to provide a light-emitting display device based on special-shaped nLED grains, which adopts special-shaped nLED grains to ensure that when a grain sheet is disposed between electrode substrates, a luminous layer of each nLED grain is always partially parallel to the electrode substrates and perpendicular to an electrode field, thus greatly improving electrical coupling efficiency and luminous efficiency.

To fulfill the above objective, the invention adopts the following technical solution:

A light-emitting display device based on special-shaped nLED grains comprises an upper drive electrode substrate, an upper drive electrode, special-shaped nLED grains, a lower drive electrode and a lower drive electrode substrate that are sequentially arranged from top to bottom, and is further provided with an AC drive control module having two ends connected to the upper drive electrode and the lower electrode respectively, wherein the special-shaped nLED grains are nLED grains each comprising a non-planar luminous layer, and at least part of the luminous layers are perpendicular to an electric field no matter in which direction the nLED grains are regularly disposed between the electrode substrates; and the drive electrode is isolated from the nLED grains by an insulating dielectric layer, and in presence of the AC drive signal, the nLED grains are lighted up through electromagnetic coupling.

Further, the special-shaped nLED grains comprise spherical nLED grains, polygonal nLED grains and rod-like nLED grains.

Further, each nLED grain comprises one luminous layer or multiple luminous layers stacked in parallel; and the spherical nLED grains and the polygonal nLED grains have a size of 1 nm-1 μm, and the rod-like nLED grains have a diameter of 1 nm-1 μm and a length of 1 μm-10 μm.

Further, long axes of the rod-like nLED grains in the device are perpendicular to the electric field.

Further, at least one of the upper drive electrode and the lower drive electrode is a transparent electrode, and the two electrodes are spaced apart from each other to form an independent space.

Further, the insulating dielectric layer is disposed on surfaces of the two drive electrodes or disposed on outer surfaces of the spherical nLED grains, so that direct electrical contact between the nLED grains and the electrodes is avoided.

Further, the AC drive control module provides an alternating voltage with a magnitude and polarity varying with time; a waveform of the alternating voltage comprises a sinusoidal waveform, a triangular waveform, a square waveform, a pulse waveform and a composite waveform thereof; and the alternating voltage is at a frequency of 1 Hz-1000 MHz and has a controllable duty cycle.

Further, the drive electrode substrates are made of rigid or flexible substrate materials, and a plurality of special-shaped nLED grains are disposed between every two pixel electrodes A light-emitting display device based on special-shaped nLED grains comprises a drive electrode substrate, and a first drive electrode, a second electrode and a third electrode disposed on the drive electrode substrate in parallel, wherein the electrodes are spaced apart from each other, and special-shaped nLED grains are regularly and dispersedly disposed between the electrodes; and the light-emitting display device is further provided with an AC drive control module having an end connected to the second drive electrode and an end connected to the first drive electrode and the third drive electrode.

Further, when an insulating dielectric layer is disposed on surfaces of two drive electrodes, direct electrical contact or carrier exchange caused by a tunneling effect exists between the special-shaped nLED grains Compared with the prior art, the invention has the following beneficial effects:

By adoption of special-shaped nLED grains, when a grain sheet is disposed between the electrode substrates, the luminous layer of each nLED grain is always partially parallel to the electrode substrates and perpendicular to an electric field, thus greatly improving electrical coupling efficiency and luminous efficiency.

In the figures: 11, upper drive electrode substrate; 12, upper drive electrode; 13, special-shaped nLED grain; 15, lower drive electrode; 14, lower drive electrode substrate: 131, insulating layer; 132, n-doped GaN layer; 133, luminous layer; 134, p-doped GaN layer; 21, drive electrode substrate; 22, first drive electrode; 23, special-shaped nLED grain; 24, second drive electrode; 25, third drive electrode.

DETAILED DESCRIPTION OF THE INVENTION

The invention will be further explained below in conjunction with the accompanying drawings and embodiments.

Figure 1:
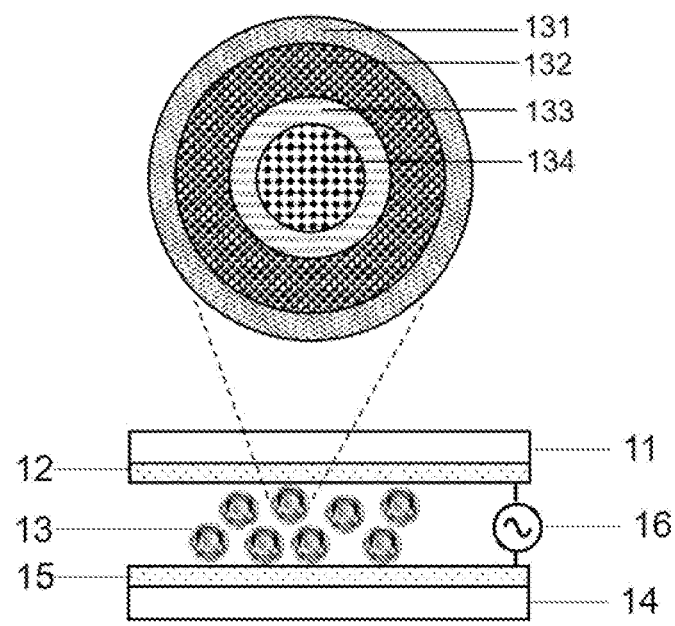
FIG. 1 is a structural diagram of a light-emitting display device based on special-shaped nLED grains in one embodiment of the invention.

Referring to FIG. 1, the invention provides a light-emitting display device based on special-shaped nLED grains, comprising an upper drive electrode substrate, an upper drive electrode, special-shaped nLED grains, a lower drive electrode and a lower drive electrode substrate that are sequentially arranged from top to bottom, wherein the light-emitting display device is further provided with an AC drive control module having two ends connected to the upper drive electrode and the lower electrode respectively; the special-shaped nLED grains are nLED grains each comprising a non-planar luminous layer, and at least part of the luminous layers are perpendicular to an electric field no matter in which direction the nLED grains are regularly disposed between the electrode substrates; and the drive electrode is isolated from the nLED grains by an insulating dielectric layer, and in presence of the AC drive signal, the nLED grains are lighted up through electromagnetic coupling.

In this embodiment, the special-shaped nLED grains comprise spherical nLED grains, polygonal nLED grains and rod-like nLED grains. The special-shaped nLED grains are GaN-based LEDs formed through an epitaxial method, and each comprise a p-doped GaN layer 134, a multi-quantum well luminous layer 133 and an n-doped GaN layer 132, and silicon oxide with a thickness of 200 nm is disposed on the surface of an epitaxial chip to form an insulating dielectric layers 131.

Preferably, the drive electrode substrates are formed by depositing indium tin oxide (ITO) on glass substrates, and have a thickness of about 150 nm and a sheet resistance of about 20 $\Omega$/sq.

Preferably, an alternating voltage is in a sinusoidal waveform and at a frequency of 100 KHz and has a peak value of 100V, the drive electrode is isolated from the nLED grains by dielectric layer, and in presence of the AC drive signal, the nLED grains are lighted up through electrical coupling.

In this embodiment, each special-shaped nLED grain comprises one luminous layer or multiple luminous layers stacked in parallel; and the spherical nLED grains and the polygonal nLED grains have a size of 1 nm-1 $\mu$m, and the rod-like nLED grains have a diameter of 1 nm-1 $\mu$m and a length of 1 $\mu$m-10 $\mu$m.

In this embodiment, long axes of the rod-like nLED grains in the device are perpendicular to the electric field.

In this embodiment, at least one of the upper drive electrode and the lower drive electrode is a transparent electrode, and the two electrodes are spaced apart from each other to form an independent space.

In this embodiment, the insulating dielectric layer is disposed on surfaces of the two drive electrodes or on outer surfaces of the spherical nLED grains, so that direct electrical contact between the nLED grains and the electrodes is avoided.

In this embodiment, the AC drive control module provides an alternating voltage with a magnitude and polarity varying with time; a waveform of the alternating voltage comprises a sinusoidal waveform, a triangular waveform, a square waveform, a pulse waveform and a composite waveform thereof; and the alternating voltage is at a frequency of 1 Hz-1000 MHz and has a controllable duty cycle.

Figure 2:
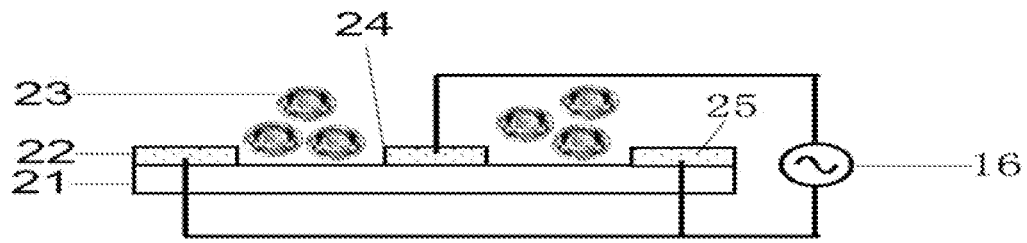
FIG. 2 is a structural diagram of special-shaped nLED grains in one embodiment of the invention.
Figure 3:
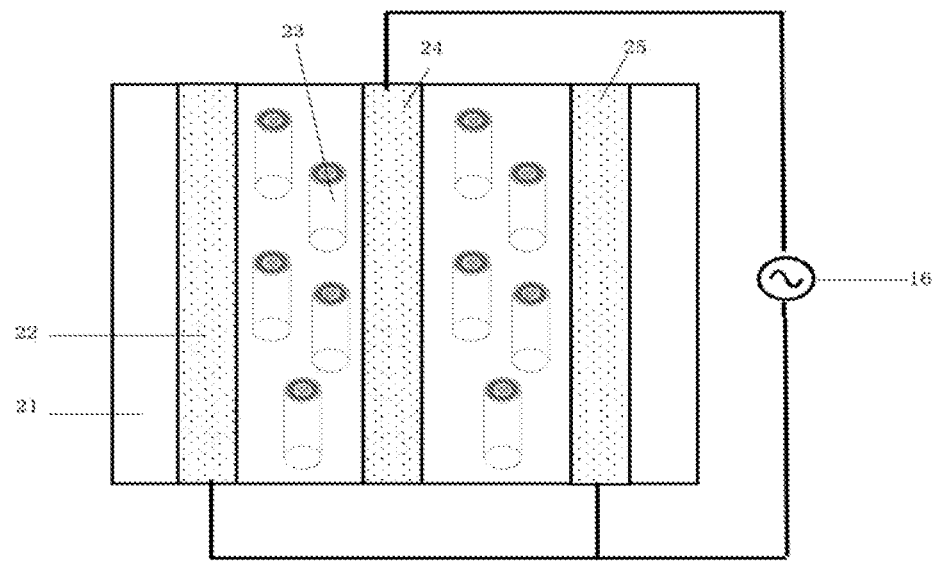
FIG. 3 is a structural diagram of a light-emitting display device based on special-shaped nLED grains in one embodiment of the invention.

As shown in FIG. 2 and FIG. 3, in another embodiment, a light-emitting display device based on special-shaped nLED grains comprises a drive electrode substrate and N electrodes disposed on the drive electrode substrate in parallel, wherein the electrodes are spaced apart from each other, and special-shaped nLED grains are regularly and dispersedly disposed between the electrodes. The light-emitting display device is further provided with an AC drive control module having two ends connected to corresponding electrodes in a spaced manner. As show in FIG. 3, when N=3, one end of the AC drive control module is connected to a second electrode, and the other end of the AC drive control module is connected to a first electrode and a third electrode.

In this embodiment, the special-shaped nLED grains are spherical nLED grains with a diameter of 100 nm, and an insulating dielectric layer is disposed on outer surfaces of the special-shaped nLED grains, so that direct electrical contact between the nLED grains and the electrodes is avoided. A grain sheet is disposed between electrode substrates through ink-jet printing.

Figure 4:
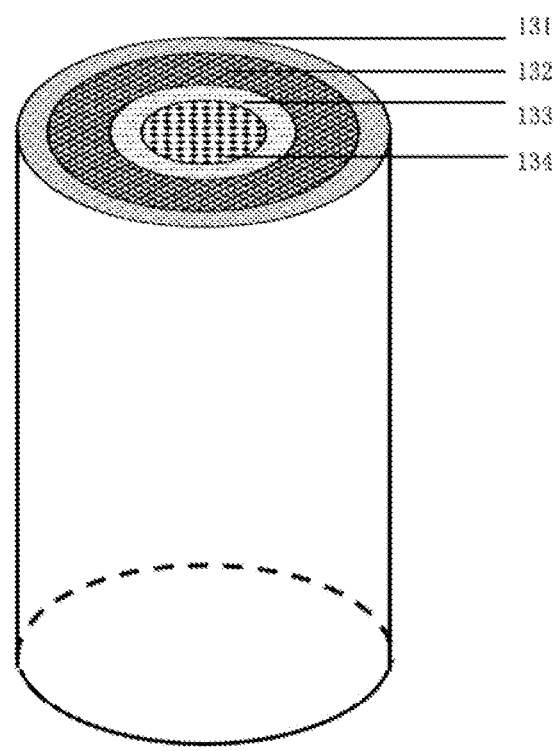
FIG. 4 is a structural diagram of special-shaped nLED grains in one embodiment of the invention.

As shown in FIG. 4, in this embodiment, the special-shaped nLED grains are cylindrical nLED grains with a diameter of 100 nm and a length of 1 $\mu$m, and the insulating dielectric layer is disposed on outer surfaces of the cylindrical nLED grains, so that direct electrical contact between the nLED grains and the electrodes is avoided. A grain sheet is disposed between electrode substrates through ink-jet printing.

Preferably, the drive electrode substrate is formed by depositing indium tin oxide (ITO) on a glass substrate, and has a thickness of about 150 nm and a sheet resistance of about 20 $\Omega$/sq.

Preferably, an alternating voltage is in a sinusoidal waveform and at a frequency of 100 KHz and has a peak value of 100V, the drive electrode is isolated from the nLED grains by a dielectric layer, and in presence of the AC drive signal, the nLED grains are lighted up through electrical coupling.

The above embodiments are merely preferred ones of the invention, and all equivalent variations and modifications made according to the patent scope of the application of invention should fall within the protection scope of the invention.

What is claimed is:

1. A light-emitting display device based on special-shaped nLED grains, comprising an upper drive electrode substrate, an upper drive electrode, special-shaped nLED grains, a lower drive electrode and a lower drive electrode substrate that are sequentially arranged from top to bottom, and being further provided with an AC drive control module having two ends connected to the upper drive electrode and the lower electrode respectively, wherein the special-shaped nLED grains are nLED grains each comprising a non-planar luminous layer, and at least part of the luminous layers are perpendicular to an electric field no matter in which direction the nLED grains are regularly disposed between the electrode substrates; and the drive electrode is isolated from the nLED grains by an insulating dielectric layer, and in presence of the AC drive signal, the nLED grains are lighted up through electromagnetic coupling.

2. The light-emitting display device based on special-shaped nLED grains according to claim 1, wherein the special-shaped nLED grains comprise spherical nLED grains, polygonal nLED grains and rod-like nLED grains.

3. The light-emitting display device based on special-shaped nLED grains according to claim 2, wherein each said nLED grain comprises one luminous layer or multiple luminous layers stacked in parallel; and the spherical nLED grains and the polygonal nLED grains have a size of 1 nm-1 µm, and the rod-like nLED grains have a diameter of 1 nm-1 µm and a length of 1 µm-10 µm.

4. The light-emitting display device based on special-shaped nLED grains according to claim 2, wherein long axes of the rod-like nLED grains in the device are perpendicular to the electric field.

5. The light-emitting display device based on special-shaped nLED grains according to claim 1, wherein at least one of the upper drive electrode and the lower drive electrode is a transparent electrode, and the two electrodes are spaced apart from each other to form an independent space.

6. The light-emitting display device based on special-shaped nLED grains according to claim 1, wherein the insulating dielectric layer is disposed on surfaces of the two drive electrodes or disposed on outer surfaces of the special-shaped nLED grains, so that direct electrical contact between the nLED grains and the electrodes is avoided.

7. The light-emitting display device based on special-shaped nLED grains according to claim 1, wherein the AC drive control module provides an alternating voltage with a magnitude and polarity varying with time; a waveform of the alternating voltage comprises a sinusoidal waveform, a triangular waveform, a square waveform, a pulse waveform and a composite waveform thereof; and the alternating voltage is at a frequency of 1 Hz-1000 MHz and has a controllable duty cycle.

8. The light-emitting display device based on special-shaped nLED grains according to claim 1, wherein the drive electrode substrates are made of rigid or flexible substrate materials, and a plurality of said special-shaped nLED grains are disposed between every two pixel electrodes.

9. A light-emitting display device based on special-shaped nLED grains, comprising a drive electrode substrate and N electrodes disposed on the drive electrode substrate in parallel, wherein the electrodes are spaced apart from each other, and special-shaped nLED grains are regularly and dispersedly disposed between the electrodes; and the light-emitting display device is further provided with an AC drive control module having two ends connected to the corresponding electrodes in a spaced manner.

10. The light-emitting display device based on special-shaped nLED grains according to claim 9, wherein when an insulating dielectric layer is disposed on surfaces of two said drive electrodes, direct electrical contact or carrier exchange caused by a tunneling effect exists between the special-shaped nLED grains.

* * * * *